US007436232B2

(12) United States Patent
Sivero et al.

(10) Patent No.: US 7,436,232 B2
(45) Date of Patent: Oct. 14, 2008

(54) REGENERATIVE CLOCK REPEATER

(75) Inventors: Stefano Sivero, Vergiate (IT); Massimiliano Frulio, Milan (IT)

(73) Assignee: Atmel Corporation, San Jose, CA (US)

( * ) Notice: Subject to any disclaimer, the term of this patent is extended or adjusted under 35 U.S.C. 154(b) by 1009 days.

(21) Appl. No.: 10/666,142

(22) Filed: Sep. 17, 2003

(65) Prior Publication Data

US 2004/0257131 A1 Dec. 23, 2004

(30) Foreign Application Priority Data

Jun. 17, 2003 (IT) .......................... MI2003A1217

(51) Int. Cl.
*H03K 5/01* (2006.01)

(52) U.S. Cl. ...................................... 327/165; 327/291

(58) Field of Classification Search ....................... None
See application file for complete search history.

(56) References Cited

U.S. PATENT DOCUMENTS 4,284,843 A 8/1981 White ...................... 178/69 G
4,403,330 A 9/1983 Meyer ........................... 375/4
4,698,826 A 10/1987 Denhez et al. ................. 375/3
4,988,892 A 1/1991 Needle ....................... 307/269
5,272,390 A 12/1993 Watson, Jr. et al. ......... 307/269
5,414,312 A 5/1995 Wong .......................... 326/83
5,440,182 A 8/1995 Dobbelaere .................. 326/38
5,517,137 A * 5/1996 Stephens, Jr. ................ 326/93
5,724,304 A 3/1998 Foss ...................... 365/230.06
6,094,086 A 7/2000 Chow ......................... 327/396
6,130,563 A 10/2000 Pilling et al. ................ 327/111
6,356,116 B1 3/2002 Oh ............................. 326/93
6,362,654 B1 3/2002 Anderson et al. ............. 326/82
6,433,605 B1 8/2002 Zhang ........................ 327/291
6,493,854 B1 12/2002 Chowdhury et al. ........... 716/6
2001/0019579 A1 9/2001 Chiou ........................ 375/211
2002/0191479 A1 12/2002 Yamauchi et al. ........... 365/233
2003/0011413 A1 1/2003 Masleid ...................... 327/165

OTHER PUBLICATIONS

H.B. Bakoglu, "Circuit, Interconnections, and Packaging for VLSI", Addison-Wesley Publishing Company, Inc., 1990, pp. 198-219.*

* cited by examiner

*Primary Examiner*—Cassandra Cox
(74) *Attorney, Agent, or Firm*—Schwegman, Lundberg & Woessner, P.A.

(57) ABSTRACT

A regenerative clock repeater comprises an edge detector and an output driver means to produce the clock signal by recovering its high logical level and low logical level. The output driver means further comprises a pull-up and a pull-down circuitry adapted to receive a pair of control signals. These control signals are generated by the edge detector to sense the rising edge and falling edge of the clock signal. Inside the edge detector, a pair of threshold level detectors detect a high and a low logical level of the clock signal and inputs the results to a combination of logic gates and a latch to keep the locations of the signal markers fixed. These fixed-location of control signals trigger the output driver means to recover the high logical level and the low logical level of said clock signal.

21 Claims, 7 Drawing Sheets

REGENERATIVE CLOCK REPEATER

TECHNICAL FIELD

The invention relates to clock signal distribution within a memory integrated circuit, and more particularly to clock repeaters placed along clock line for recovering the logic levels of the clock signals.

BACKGROUND ART

In a digital synchronous system, effective clock distribution is essential for the system to work properly. Unduly slow propagation of a clock signal may limit the ability of a system's components to maintain adequate synchrony with each other. Moreover, a degraded clock signal can cause the system to malfunction completely, even with otherwise flawless design and components. With reference to FIG. 1, a representative clock distribution line 100 includes a reference clock signal 102 having a low logical level $V_L$ and a high logical level $V_H$, a clock input buffer or driver 104. The distribution line 100 has an intrinsic resistance (R) and capacitance (C), 106, and a load capacitance 108 at the receiving end. The clock signal 102 is completely specified by a periodic high and low voltage levels ($V_H$ and $V_L$), ideally with a square waveform.

When the resistance R of the line is comparable to or larger than the ON resistance of the driver, the propagation delay $t_d$ is proportional to the RC time constant value. Because both resistance R and capacitance C increase linearly with length, this propagation delay $t_d$ increases proportionally to the square of the line length. The degradation of the clock signal 102 is caused by the RC time constant of the clock distribution line 100 connecting the input buffer 104 to the gates having load capacitance $C_L$ 108. The clock signal 102 suffers degradation to the point that its original high $V_H$ and low $V_L$ values are distorted out of their original values. This is illustrated by an output clock signal 110. The RC component in the distribution line 100 acts as a low pass filter that causes the clock signal 102 to have a rise time and fall time proportional to the time constant RC. As a result, the clock signal 102 does not retain the original clock signal waveform. Therefore, a clock distribution network that minimizes propagation delay and signal degradation of a clock signal is needed.

There exist different approaches attempting to solve the above problem. Each approach depends on different intrinsic resistance and capacitance values of the clock distribution line 106. In one approach, the line is divided into smaller sections so that the time delay $t_d$ is approximately linear with length, instead of the square of the length. With reference to FIG. 2A, the clock distribution line 200A is divided into k segments. The objective of this prior art approach is to find the optimum number of segments k that will minimize the propagation delay $t_d$.

Assume that total line resistance is R and total line capacitance is C. Each segment of the line is bounded by a minimum size inverting buffer or driver 204A with a characteristic input capacitance $C_i$, 202A, and a characteristic output impedance $R_o$, 206A. Each segment also has a distributed RC characteristic 208A. The distributed resistance $R_s$, 208A, of each segment equals to R/k, and the distributed capacitance $C_s$ of each segment equals to C/k, assuming all segments are of the same length. The 50% propagation delay (the time at which Vout/Vin=0.5 in FIG. 3) can be expressed as $T\_50\%=k[0.7R_0(C_s+C_i)+R_s(0.4C_s+0.7C_i)]$, where the factor 0.7 refers to the RC term made of lumped resistance and capacitance (here $R_0$ and $C_i$) and the factor 0.4 refers to the RC term made of a distributed resistance and capacitance (here $R_s$ and $C_s$). The minimum value of T_50% gives the optimal k value, $K\_opt=sqrt\{0.4\ RC/0.7R_0C_i\}$. For this optimal k value, the delay of a single segment connecting two inverters is equal to that of the single inverter, $0.4R_sC_s=0.7R_0C_i$.

With reference to FIG. 2B, in another approach, the propagation delay $t_d$ can be further improved by increasing the size of the repeaters 204B by a factor h. The input capacitance 202B is now $hC_i$, the output impedance 201B is now $R_o/h$, and the distributed RC component 208B remains unchanged. In this case, the optimal values for k and h become: $K\_opt=sqrt\{0.4RC/0.7R_0C_i\}$, and $H\_opt=sqrt\{R_0C/RC_i\}$.

FIG. 3 illustrates the effect of lumped and distributed RC characteristic of clock distribution lines on the clock signal 300. In FIG. 3 the effect of the lumped RC is worse than that of the distributed RC on the clock signal 300. It takes the output voltage of a received clock signal 0.7 RC of time to reach 0.5 of its high logic value for a lumped-RC line 302, while it only takes the output voltage only 0.4 RC to reach the same level for a distribution-RC line 304. The severe effect of a lumped RC line 302 on the clock signal is ameliorated by the approach taken in FIG. 2B of increasing the repeater by an factor of h.

With reference to FIG. 4, another approach uses, instead of a single-inverter repeaters, repeater drivers made up of pairs of inverters 402 and 404 connected in series. In this way, the polarity of the clock signal traveling along the distribution line segment 406 remains the same at any point along the clock distribution line 400.

In all of the approaches described above, the repeater structure needs the clock signal received at a repeater input to cross the threshold of the inverter in order to work. If the RC value of the distribution line is very high, the k_opt value will be great and the minimum propagation delay at this optimum value will still be large.

An object of the present invention is to provide repeater structure for a clock distribution line that reduces the total propagation delay compared to prior repeater structure.

SUMMARY OF THE INVENTION

The object of the invention is achieved by a regenerative clock repeater that uses an output driver means which receives information about the rising edge and falling edge to recover a high logical level ($V_H$) and a low logical level ($V_L$) of a clock signal. In order to achieve the above objective, the regenerative clock repeater comprises an edge detector that generates a pull-up control signal whenever it senses the rising edge and a pull-down control signal whenever it senses the falling edge of the clock signal. In the preferred embodiment of the invention, in the edge detector a high-threshold-level inverter and a low-threshold-level inverter are used to generate pull-up and pull-down control signals. The relative timing of these control signals with respect to the clock signal edges may be kept fixed by a plurality of logic gates and a latch. An output driver is triggered by the pull-up control signal and the pull-down control signal to recover the high logical level ($V_H$) and the low logical level ($V_L$) of the clock signal.

PREFERRED EMBODIMENT OF THE DESCRIPTION

Figure 1:
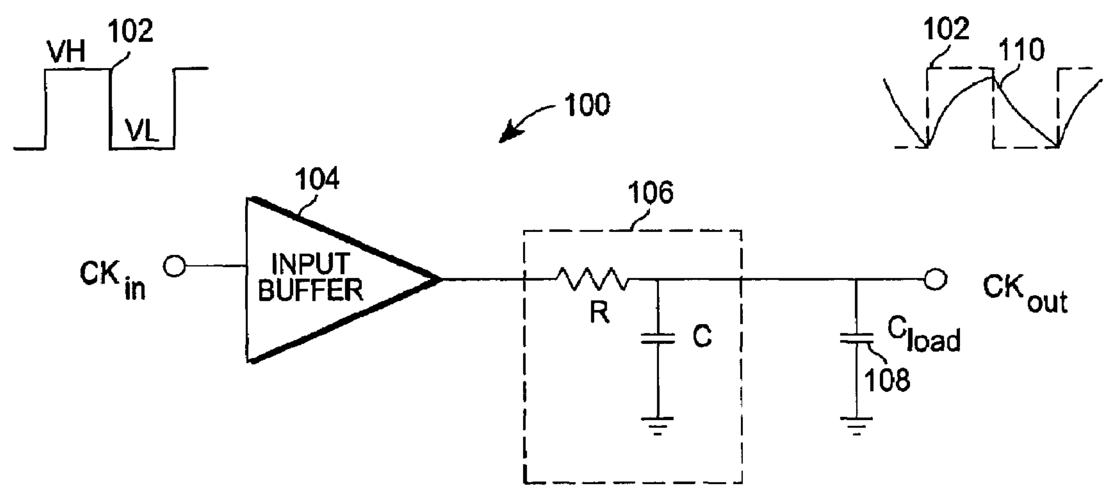
FIG. 1 illustrates a schematic diagram of a clock signal coupled to a representative distribution line of the prior art having intrinsic RC characteristics.
Figure 2A:
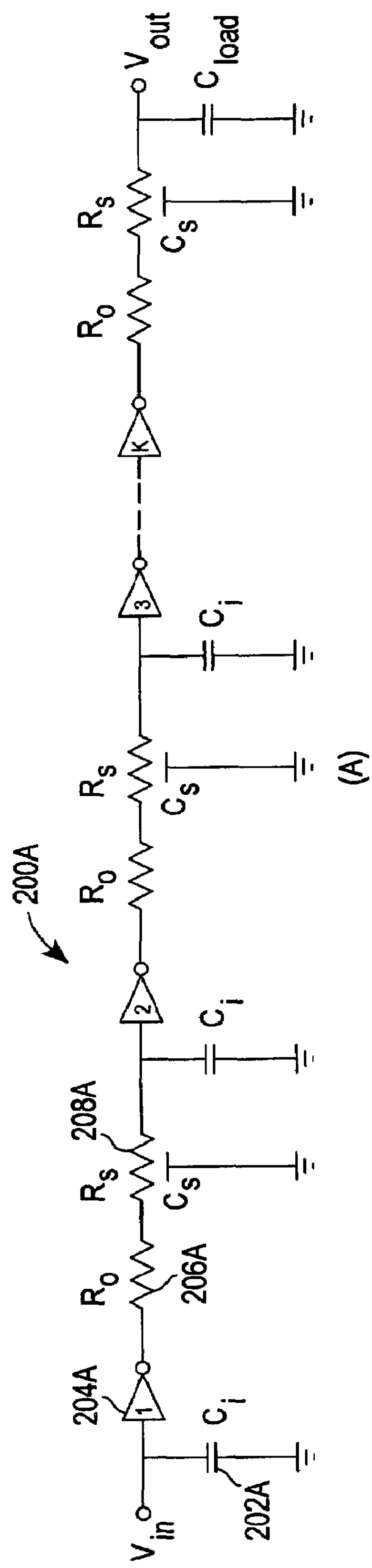
FIG. 2A illustrates a schematic diagram of a multistage circuit of the prior art to reduce the propagation delay $t_d$ caused by intrinsic resistance and capacitance in the clock distribution line.
Figure 2B:
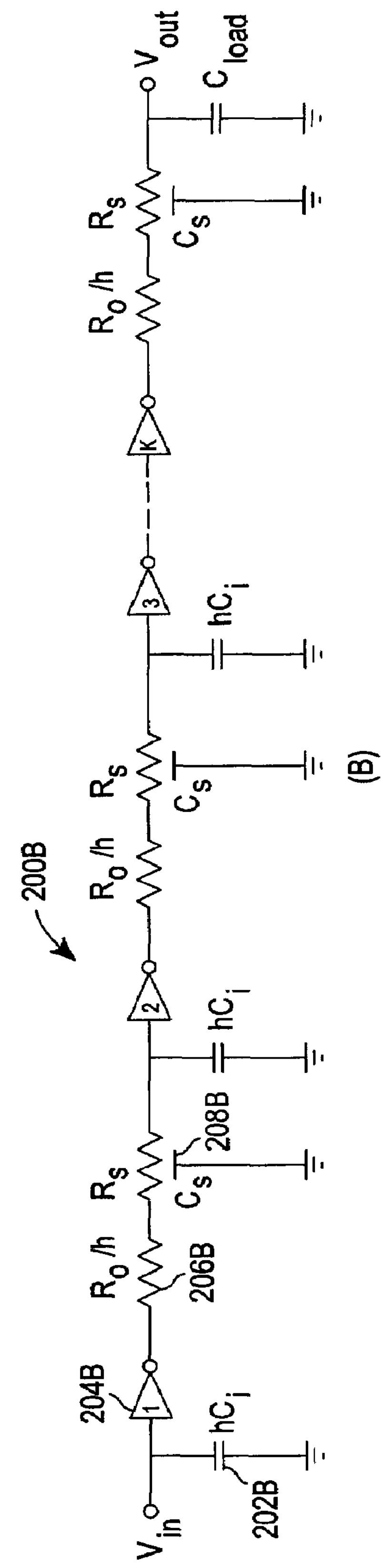
FIG. 2B illustrates schematic diagram of another approach of the prior art to further reduce the propagation delay caused by intrinsic resistance and capacitance in the clock distribution line by increasing the h factor of the repeater.
Figure 3A:
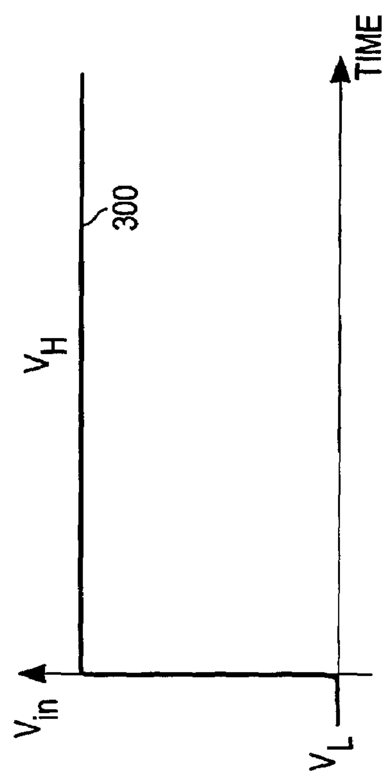
FIG. 3 illustrates graphs of the effects of the lumped and distributed RC characteristic of a clock distribution line on the clock signal.
Figure 3B:
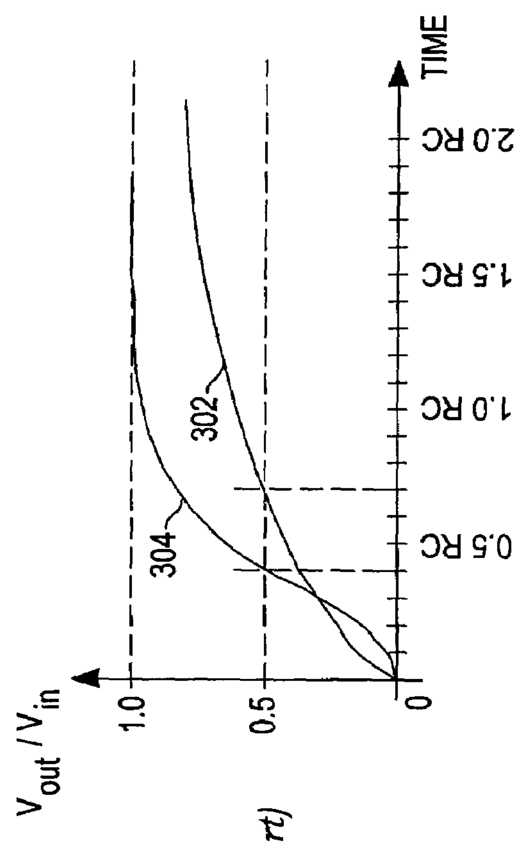
Figure 4:
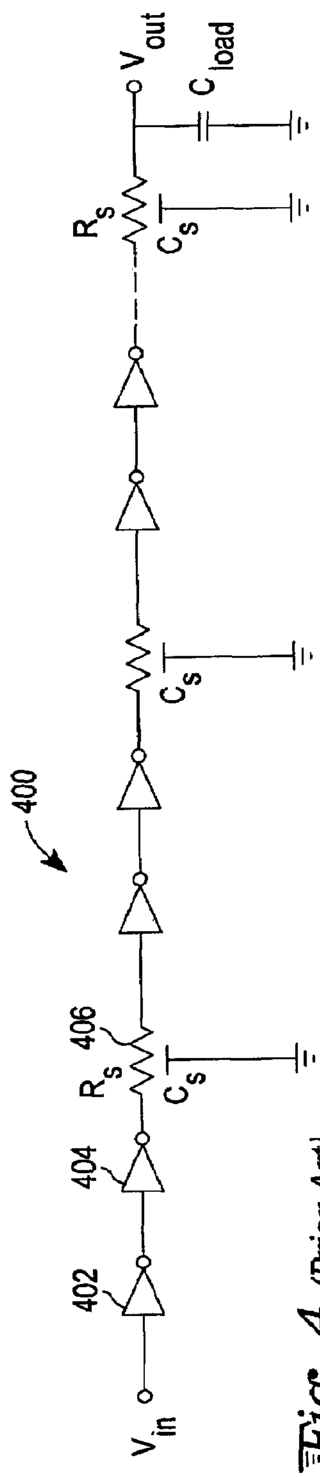
FIG. 4 illustrates a schematic diagram of yet another prior art approach using repeaters made up of inverter pairs connected in series in a clock distribution line to keep the polarity of the clock signal the same at any point of the line.
Figure 5:
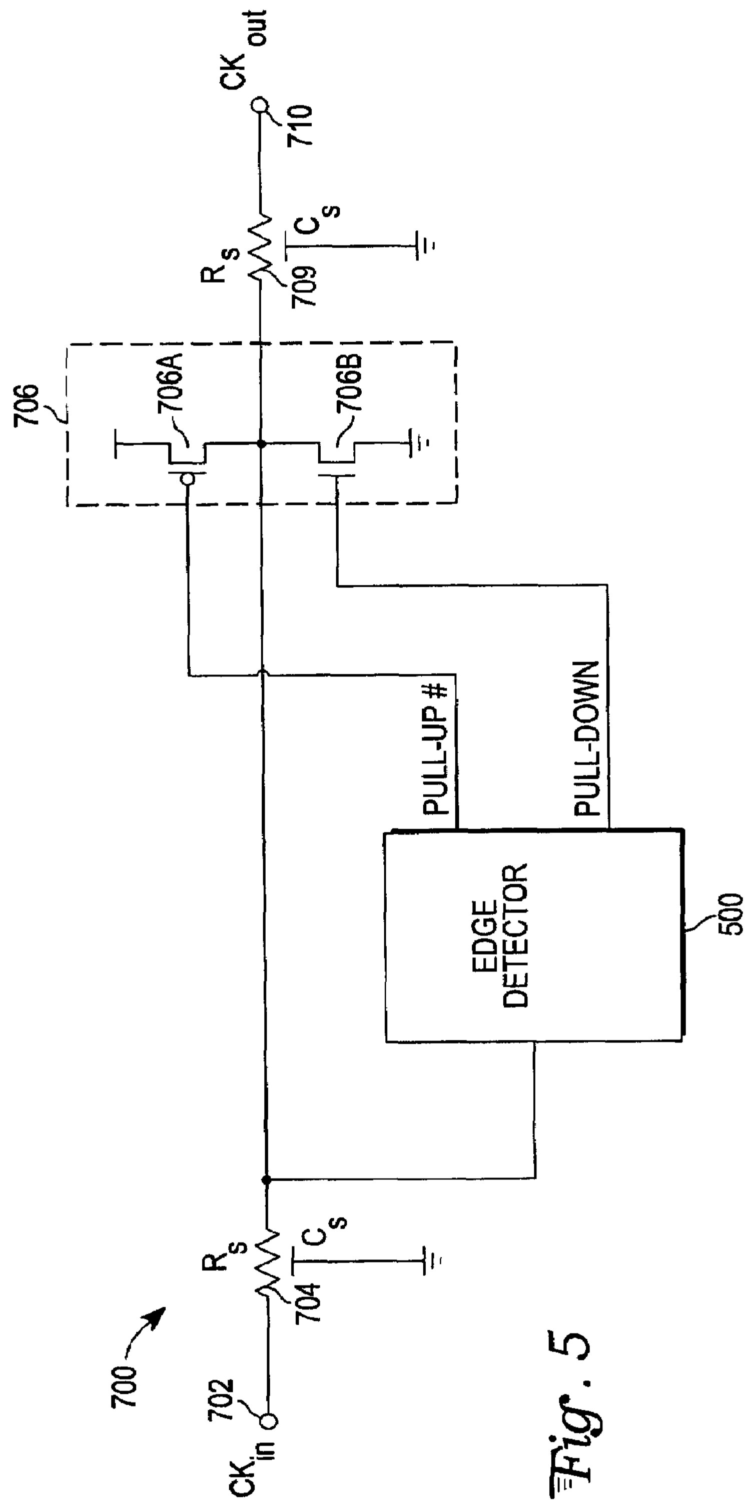
FIG. 5 is a schematic block diagram illustrating the general features of a regenerative clock repeater circuit in accord with the present invention.

With reference to FIG. 5, a regenerative clock repeater 700 according to the present invention, that recovers the low logical level ($V_L$) and a high logical level ($V_H$) of a degraded clock signal, comprises an edge detector circuit 500 and an output driver circuit 706. The edge detector circuit 500 receives a clock signal $CK_{IN}$ from a segment of clock distribution line 702 characterized by an intrinsic RC impedance 704 and generates either a pull-up control signal (PULL-UP#) or a pull-down control signal (PULL-DOWN) based on the logic level of the clock signal 702. The pull-up control signal (PULL-UP#) is generated by a sensed rising edge of the clock signal passing above a low threshold voltage level, the pull-down control signal (PULL-DOWN) is generated by a sensed falling edge of the clock signal passing below a high threshold voltage level. The output driver 706 has a pull-up transistor 706A (usually p-type) connected to a power supply at a high logical level ($V_H$) and a pull-down transistor 706B (usually n-type) connected to a power supply at a low logical level ($V_L$) typically ground. The pull-up and pull-down transistors 706A and 706B, respectively, receive the pull-up control signal and the pull-down control signal to recover the high logical level ($V_H$) and a low logical level ($V_L$) of the received degraded clock signal and place the recovered clock onto another segment of the clock distribution line which is likewise characterized by an intrinsic RC impedance 709 and whose output is the $Ck_{out}$ at node 710.

Figure 6:
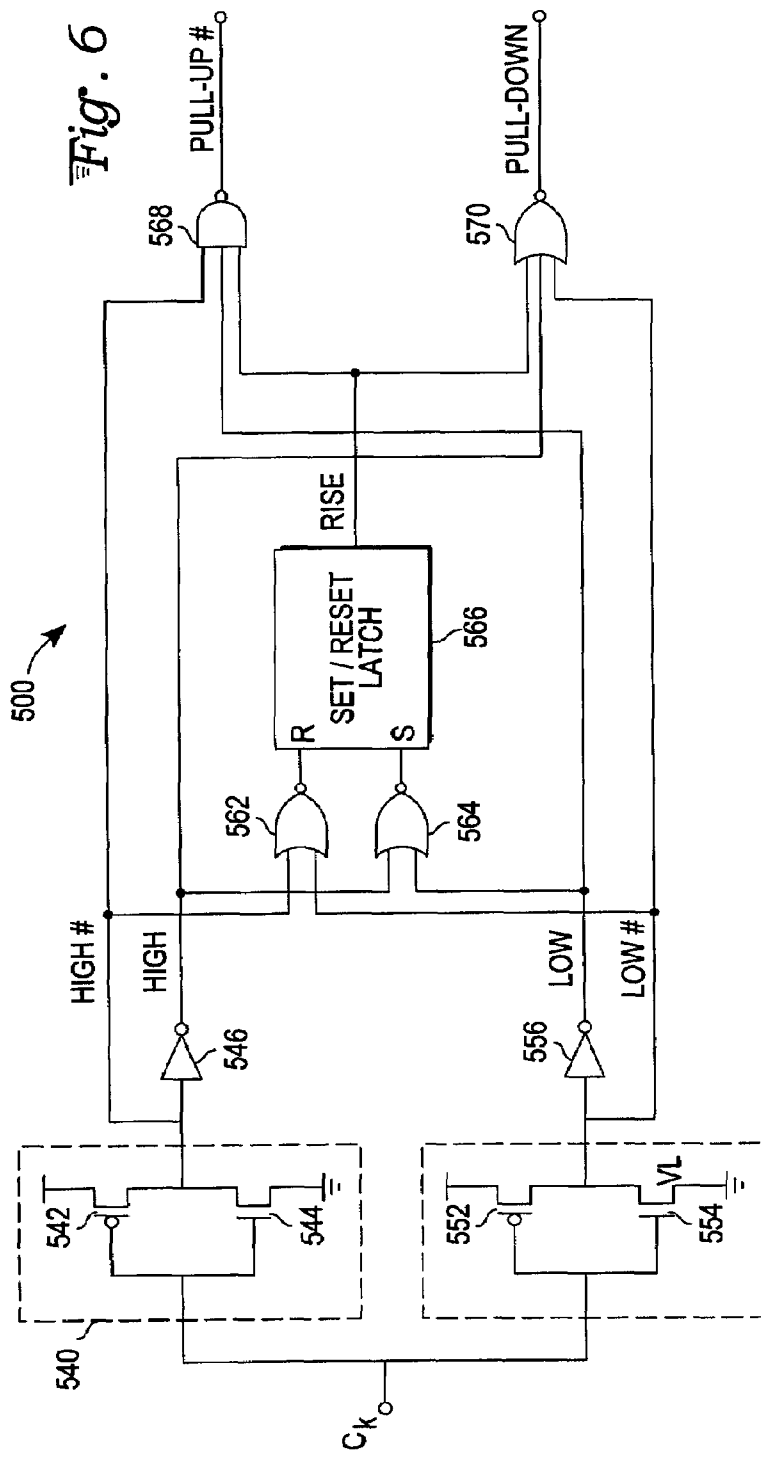
FIG. 6 is a schematic circuit diagram of a preferred embodiment of the edge detector used in the repeater circuit of FIG. 5.

With reference to FIG. 6, the edge detector 500 includes a high-threshold-level inverter (IVH) 540 and a low-threshold-level inverter (IVL) 550, both coupled to a clock input 502. The high-threshold-level inverter 540 generates a first signal (HIGH#) and also an inverse of this signal (HIGH) via an inverter 546. The low-threshold-level inverter (IVL) generates a second signal (LOW#) and also an inverse of this signal (LOW) via an inverter 556. These four signals are input into NOR logic gates 562 and 564, the outputs of which are input into a set/reset latch 566. The output of latch 566, together with the four (HIGH, HIGH#, LOW, LOW#) signals, are input into NAND and NOR logic gates 568 and 570 to generate the pull-up control signal (PULL-UP#) and the pull-down control signal (PULL-DOWN).

The high-threshold-level inverter (IVH) 540 is made up of a low threshold p-channel transistor 542 and a high threshold n-channel transistor 544. The low-threshold-level PMOS transistor 542 is used as a pull-up transistor with its source connected to a voltage supply. The high-threshold level NMOS transistor 544 is used as a pull-down transistor with its source connected to an electrical ground. The gates of the low-threshold PMOS transistor 542 and the high-threshold level pull-down NMOS transistor 544 are both connected to the clock input Ck. Finally, the drain of the low-threshold PMOS transistor 542 and the drain of the NMOS transistor 544 together form an inverter output producing the signal HIGH#.

Figure 7B:
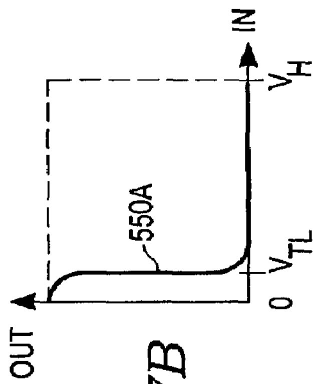
FIGS. 7A and 7B are graphs illustrating the operation of the high and low trigger point inverter used in the edge detector in FIG. 6.
Figure 7A:
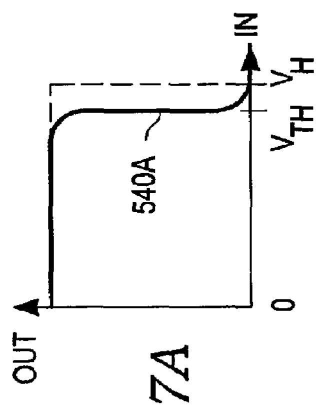

FIG. 7A illustrates the transfer function characteristics of a high-threshold-level inverter (IVH) 540 used in this invention. The low-threshold PMOS transistor 542 and the high-threshold NMOS transistor 544 in the high-threshold-level inverter (IVH) 540 cause the threshold voltage $V_{th}$ to be very high and the distance between $V_{th}$ and $V_H$ to be very narrow. This is illustrated by the curve 540A.

Returning to FIG. 6, the low-threshold-level inverter (IVL) 550 comprises high-threshold-level PMOS transistor 552 acting as a pull-up transistor coupled with a low-threshold-level NMOS 554 acting as a pull-down transistor. The low-threshold-level inverter (IVL) 550 generates the second signal (LOW#) by detecting a rise above a predetermined low logical level ($V_L$) on the input clock signal 502. The second signal (LOW#) is input into the inverter 556 to generate the inverse signal (LOW). In the low-threshold-level inverter (IVL) 550, a low-threshold-level NMOS transistor 554 is used as a pull-down transistor with its source connected to the electrical ground 547. A high-threshold-level PMOS transistor 552 is used as a pull-up transistor with its source connected to the power supply 543. The gates of the high-threshold-level PMOS transistor 552 and of the low-threshold-level NMOS transistor 554 are both connected to the clock signal input 502. Finally, the drain of the high-threshold-level PMOS transistor 552 and the drain of the low-threshold-level NMOS transistor 554 together form an inverter output producing the signal LOW.

In FIG. 7B, the transfer function of the low-threshold-level inverter (IVL) 550 is seen to be the opposite of the high-threshold-level inverter (IVH) 540. Unlike the high-threshold-level inverter (IVH) 540, the low-threshold-level inverter (IVL) 550 has a low-threshold voltage ($V_{th}$) to detect transitions of the clock signal 502. The distance between $V_{th}$ to $V_H$ is very large.

The output of the high-threshold-level detector (IVL) 540 HIGH# and that of the low-threshold-level detector (IVH) 550 LOW# are input into a first NOR gate 562. The output of the first NOR gate 562 is input to a reset terminal of a set/reset latch 566. The inverse outputs HIGH and LOW are input into a second logic NOR gate 564. The output of the second NOR gate 564 is input into the set terminal of the set/reset latch 566. Output of the set/reset latch 566 is called RISE signal. This signal RISE indicates whether the edge of the clock signal 502 is rising or falling. In general, the set/reset latch 566 only goes HIGH when the set terminal is HIGH and goes LOW when reset terminal is HIGH. When both set and reset terminals are LOW or zero, the latch 566 retains its previous value, $Q_{n+1}=Q_n$.

Together with the inverter signals HIGH# and LOW, the RISE signal is input into a first NAND gate 568 to provide a pull up control signal (PULL_UP#). The signals HIGH, LOW#, and RISE are input into a third NOR logic gate 570 to produce a pull-down control signal (PULL_DOWN).

Figure 8:
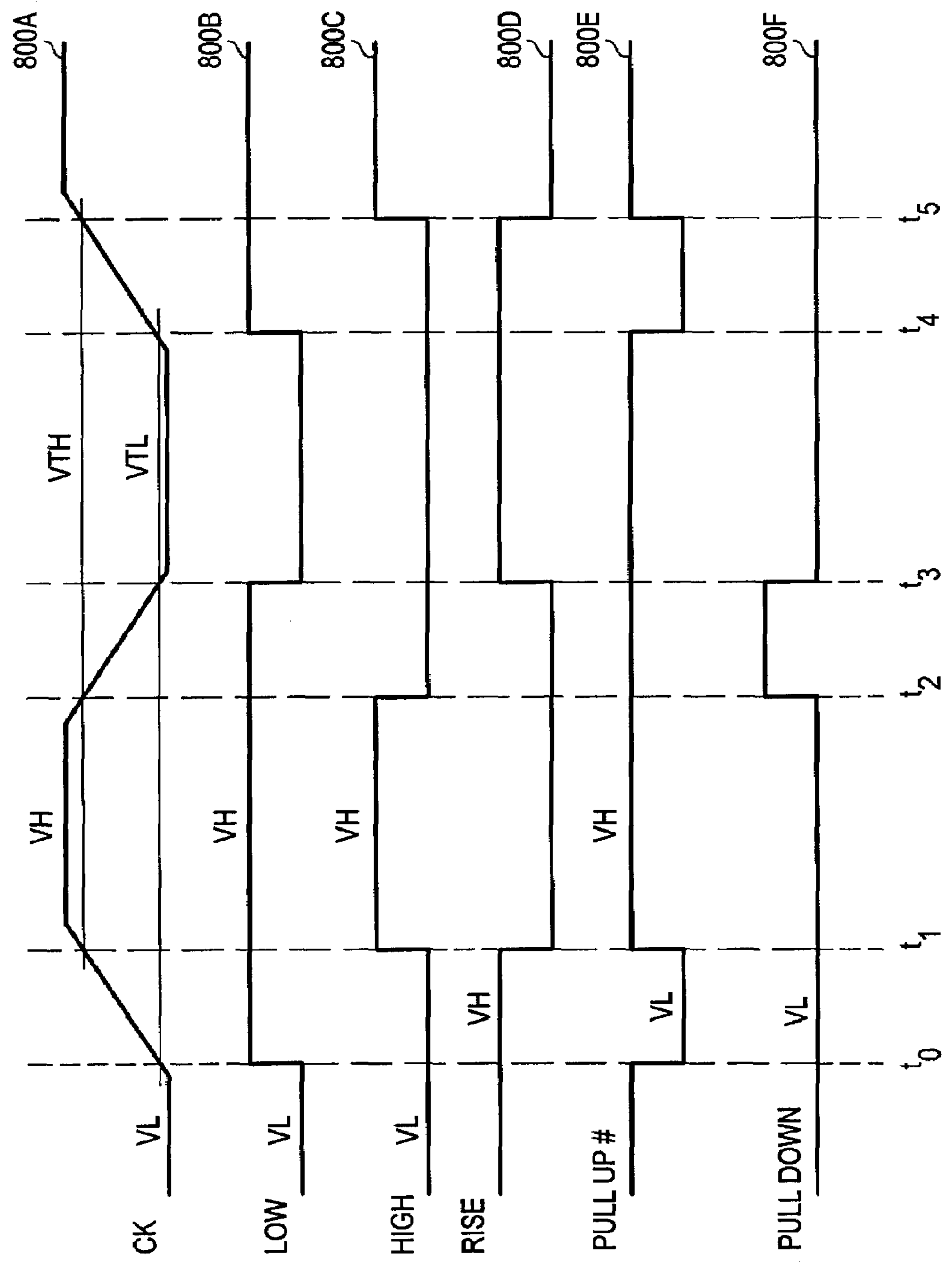
FIG. 8 illustrates a signal timing diagram showing operation of the circuit of elements of a regenerative clock repeater of FIGS. 5 and 6 according to the present invention.

With reference to FIG. 8, curve 800A illustrates the clock signal at the input 502 in FIG. 5. This received clock signal is defined by its low ($V_L$) and high ($V_H$) logical levels, but has degraded due to the RC characteristic of the clock distribution line along which it has propagated, and thus has a ramped waveform with relatively long rise and fall times instead of well-defined edge transitions. The high-threshold-level inverter (IVH) 540 detects clock transitions across the high-threshold level ($V_{TH}$) near the high logical level $V_H$, while the low level inverter (IVL) detects clock transitions across the low-threshold line ($V_{TL}$) near the low logical level $V_L$. During the rising of the clock, a transition across the low-threshold level ($V_{TL}$) occurs at $t_0$ and again later at $t_4$. A transition across the high-threshold level ($V_{TH}$) occurs at $t_1$ (and again later at $t_5$) The period between $t_0$ and $t_1$ is characterized by a pulse of the pull up control signal (PULL-UP#), shown in curve 800E. During the fall of the clock, a transition across the high-threshold level ($V_{TH}$) occurs at time $t_2$ (and at later times not shown after $t_5$). A transition across the low-threshold level ($V_{TL}$) occurs at $t_3$ (and again later times now shown). The time period between $t_2$ and $t_3$ is characterized by a pulse of the pull-down control signal (PULL-DOWN), shown in curve 800F.

With reference to curve 800B, as the input clock signal CK, 800A, crosses the low logical level $V_L$, the low trigger point inverter 550 pulls its output LOW# to ground and its complement LOW goes high, as seen for signal 800B. The edges of LOW signal are at $t_0$ and $t_3$.

Referring to curve 800C, as the clock signal Ck increases, the low-threshold level PMOS 542 is conducting and thus the output HIGH# is at $V_H$. During this time the high-threshold level NMOS 544 does not conduct. Only when the clock signal 502 reaches $V_{TH}$, the low-threshold PMOS 544 can prevent current from flowing across the channel and becomes non-conducting. In the mean time, the high-threshold NMOS becomes conduct. As a result, the high-threshold level NMOS 544 takes over and pull the output (HIGH#) to low. In FIG. 800C, the graph for HIGH represents the inverse of the HIGH# output. The edges of HIGH signal are at t1 and t2 respectively.

With reference to curve 800D, the output response RISE of the set/reset latch 566 is illustrated. The set terminal of the latch 566 is HIGH when both HIGH, LOW terminals of the NOR gate 564 are LOW. On the other hand, the reset is only HIGH when both HIGH#, LOW# are LOW logic or zero. The falling edge of the RISE signal is at $t_1$, indicating the clock rise has terminated. The rise edge of the RISE signal is at $t_3$, indicating the fall edge of the clock has terminated.

Graph 800E illustrates the pull-up control signal (PULL_UP#) and the manner it senses the rising edge of the clock signal shown in graph 800A. Also, the pulse duration of the pull-up control signal indicates the time distance between $t_0$ and $t_1$.

Graph 800F illustrates the pull-down control signal (PULL_DOWN) and the manner it detects the falling edge of the clock signal shown in graph 800A. The pulse duration of the fall down control signal indicates the time distance between $t_2$ and $t_3$.

Figure 9:
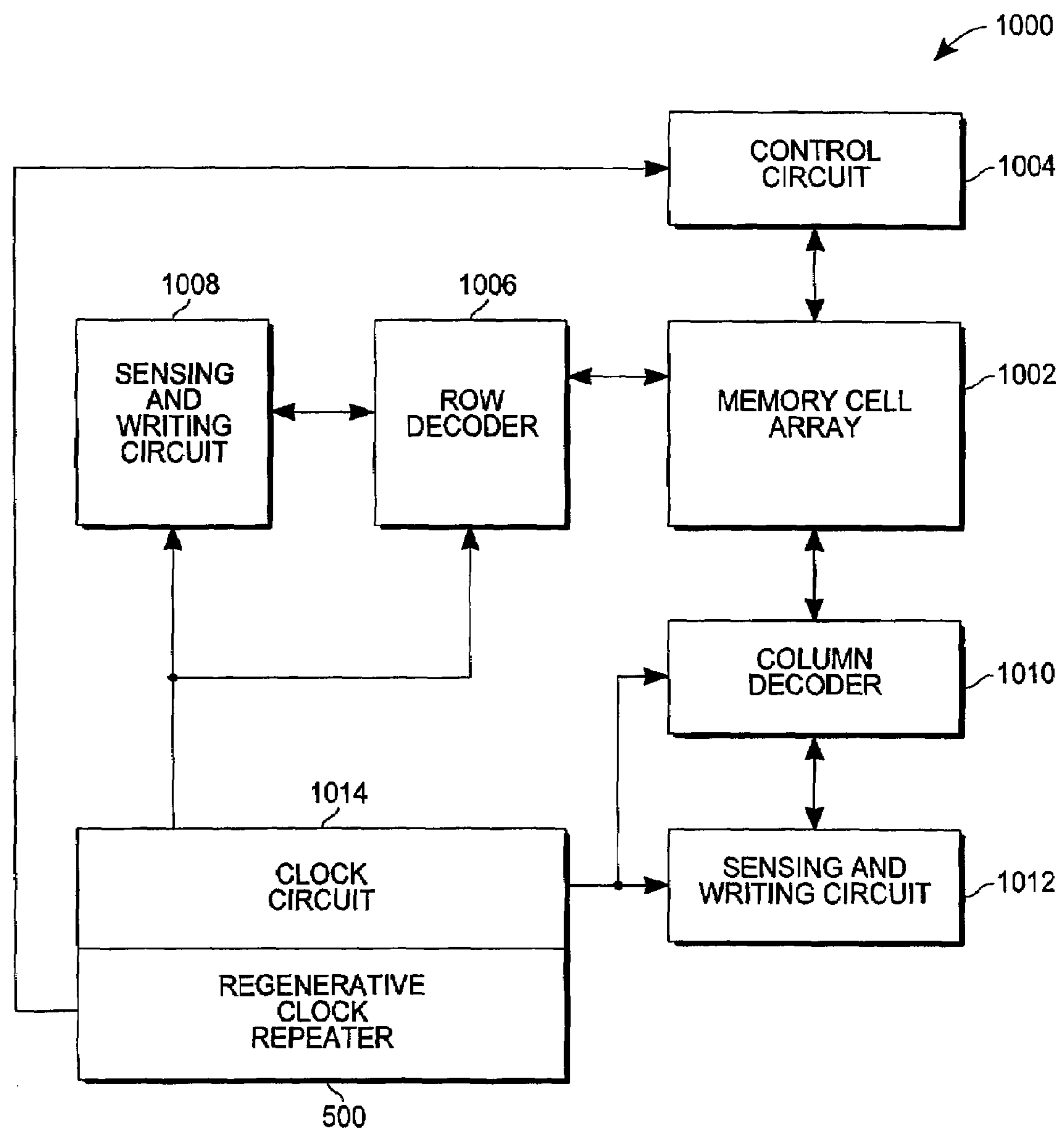
FIG. 9 illustrates a memory device that uses the regenerative clock repeaters as described in FIG. 5.

With reference to FIG. 9, a synchronous memory device 1000 includes regenerative clock repeaters 500 as described above to regenerate the clock signal on clock lines at different locations of the memory device 1000. This illustrates a typical use for the clock repeaters in integrated circuitry. A typical memory device 1000 includes a memory array 1002, a control circuit 1004, a row decoder 1006, a column decoder 1010, sensing and writing circuit 1008 and 1012, a clock circuit 1014. Regenerative clock repeaters 500 are distributed throughout the device 1000 along clock distribution lines, which are divided into segments.

What is claimed is:

1. A clock repeater for regenerating a clock signal on a clock distribution line, comprising:

- an edge detector means for sensing a rising edge and a falling edge of said clock signal and generating respective pull-up and pull-down control signals in response thereto; and
- an output driver means, connected to said edge detector means to receive said control signals therefrom, for recovering high and low logical levels of said clock signal;
- wherein said edge detector means further comprises:
  - a level detector means for generating a first signal and a second signal by detecting a rise edge from a low logical level and a fall edge from a high logical level of said clock signal;
  - a first logic NOR gate adapted to receive an inverse of the first signal and an inverse of the second signal;
  - a second logic NOR gate adapted to receive the first signal and the second signal;
  - a set/reset latch coupled to an output of the first logic NOR gate at a set input terminal, and an output of the second logic NOR gate at the reset input terminal to produce a third signal;
  - a first logic NAND gate adapted to receive the first signal, the inverse of the second signal and the third signal to generate the pull-up control signal; and
  - a third logic NOR gate adapted to receive the inverse of the first signal, the second signal, and the third signal to generate the pull-down control signal.

2. The clock repeater of claim 1, wherein said level detector means further comprises a first level detector means for detecting said high logical level and a second level detector means for detecting said low logical level of said clock signal.

3. The clock repeater of claim 2, wherein said first level detector means further comprising:

- a low-threshold PMOS transistor and a high-threshold NMOS transistor for detecting said high logical level of said clock signal, wherein the gate of said low-threshold PMOS transistor and the gate of said high-threshold NMOS transistor being coupled together and to said clock signal, the drain of said low-threshold PMOS transistor being coupled to the drain of the high-threshold NMOS transistor, the source of said low-threshold PMOS being coupled to a supply voltage, and the source of said high-threshold NMOS transistor being coupled to an electrical ground; and
- a first inverter having an input terminal coupled to the drain-drain junction of said low-threshold PMOS transistor and said high-threshold NMOS transistor to produce the said first signal, wherein the output terminal of said first inverter being the inverse of said first signal.

4. The clock repeater of claim 2, wherein said second level detector means further comprises:

- a high-threshold PMOS transistor and a low-threshold NMOS transistor for detecting said low logical levels of said clock signal, wherein the gate of said high-threshold PMOS transistor and the gate of said low-threshold NMOS transistor being coupled together, the drain of said high-threshold PMOS transistor being coupled to the drain of the low-threshold NMOS transistor, the source of said high-threshold PMOS transistor being coupled to said supply voltage, and the source of said low-threshold NMOS transistor being coupled to said electrical ground; and a second inverter having an input terminal coupled to the drain-drain junction of the high-threshold PMOS transistor and said low-threshold NMOS transistor to produce said second signal, wherein the output terminal of said second inverter being the inverse of said second signal.

5. A clock repeater for regenerating a clock signal on a clock distribution line, comprising:

an edge detector means for sensing a rising edge and a falling edge of said clock signal and generating respective pull-up and pull-down control signals in response thereto; and an output driver means, connected to said edge detector means to receive said control signals therefrom, for recovering high and low logical levels of said clock signal; wherein said output driver means further comprises:

a pull-up PMOS transistor;

a NMOS pull-down transistor coupled to said pull-up PMOS transistor, wherein the gate of the said PMOS pull-up transistor being coupled to said pull-up control signal, the drain of said pull-up PMOS transistor being coupled to the drain of the NMOS pull-down transistor and to said clock signal, the source of the PMOS pull-up transistor being coupled to said voltage supply, a gate of the NMOS pull-down transistor being coupled to said pull-down control signal, and the source of said pull-down NMOS transistor coupled to said electrical ground.

6. A clock repeater for regenerating a clock signal on a clock distribution line, comprising:

(a) an edge detector means for sensing a rising edge and a falling edge of said clock signal and generating respective pull-up and pull-down control signals in response thereto, the edge detector means including:

(i) a level detector means for generating a first signal and a second signal by detecting a low logical level and a high logical level of said clock signal;

(ii) a first logic NOR gate adapted to receive an inverse of the first signal and an inverse of the second signal;

(iii) a second logic NOR gate adapted to receive the first signal and a second signal;

(iv) a set/reset latch coupled to the output of the first logic NOR gate at a set input terminal, and the output of the second logic NOR gate at the reset input terminal to produce a third signal;

(v) a first logic NAND gate adapted to receive the first signal, the inverse of the second signal and the third signal to generate the pull-up control signal; and (vi) a third logic NOR gate adapted to receive the inverse of the first signal, the second signal, and the third signal to generate the pull-down signal; and (b) an output driver means, connected to said edge detector means to receive said control signals therefrom, for recovering high and low logical levels of said clock signal, the output driver means including:

(i) a pull-up PMOS transistor;

(ii) a NMOS pull-down transistor coupled to said pull-up PMOS transistor, wherein the gate of the said PMOS pull-up transistor being coupled to said pull-up control signal, the drain of said pull-up PMOS transistor being coupled to the drain of the NMOS pull-down transistor and to said input clock signal, the source of the PMOS pull-up transistor being coupled to said voltage supply, a gate of the NMOS pull-down transistor being coupled to said pull-down control signal, and the source of said pull-down NMOS transistor coupled to said electrical ground.

7. The clock repeater of claim 6, wherein said level detector means further comprises a first level detector means for detecting said high logical level and a second level detector means for detecting said low logical level of said clock signal.

8. The clock repeater of claim 7, wherein said first level detector means further comprising:

a low-threshold PMOS transistor and a high-threshold NMOS transistor for detecting said high logical level of said clock signal, wherein the gate of said low-threshold PMOS transistor and the gate of said high-threshold NMOS transistor being coupled together and to said clock signal, the drain of said low-threshold PMOS transistor being coupled to the drain of the high-threshold NMOS transistor, the source of said low-threshold PMOS being coupled to a supply voltage, and the source of said high-threshold NMOS transistor being coupled to an electrical ground; and a first inverter having an input terminal coupled to the drain-drain junction of said low-threshold PMOS transistor and said high-threshold NMOS transistor to produce the said first signal, wherein the output terminal of said first inverter being the inverse of said first signal.

9. The regenerative clock repeater of claim 7, wherein said second level detector means further comprises:

a high-threshold PMOS transistor and a low-threshold NMOS transistor for detecting said low logical levels of said clock signal, wherein the gate of said high-threshold PMOS transistor and the gate of said low-threshold NMOS transistor being coupled together, the drain of said high-threshold PMOS transistor being coupled to the drain of the low-threshold NMOS transistor, the source of said high-threshold PMOS transistor being coupled to said supply voltage, and the source of said low-threshold NMOS transistor being coupled to said electrical ground; and a second inverter having an input terminal coupled to the drain-drain junction of the high-threshold PMOS transistor and said low-threshold NMOS transistor to produce said second signal, wherein the output terminal which is the inverse of said second signal.

10. A synchronous semiconductor memory device, comprising:

a memory cell array including a plurality of memory cells arranged in rows and columns;

a data input/output terminal;

a control circuit controlling operations of said synchronous semiconductor memory device;

a sensing and writing circuit;

a row/column address decoder for selecting rows and columns of said memory cell array; and a clock circuit for synchronizing said operations of said synchronous semiconductor memory device, wherein said clock circuit comprises a plurality of regenerative clock circuits distributed along clock lines within said memory device, each of which further comprises:

(a) an edge detector means for sensing a rising edge and a falling edge of said clock signal and generating respective pull-up and pull-down control signals in response thereto, the edge detector means including:

(i) a level detector means for generating a first signal and a second signal by detecting a low logical level and a high logical level of said clock signal;

(ii) a first logic NOR gate adapted to receive an inverse of the first signal and an inverse of the second signal;

(iii) a second logic NOR gate adapted to receive the first signal and a second signal;

(iv) a set/reset latch coupled to an output of the first logic NOR gate at a set input terminal, and an output of the second logic NOR gate at the reset input terminal to produce a third signal;

(v) a first logic NAND gate adapted to receive the first signal, the inverse of the second signal and the third signal to generate the pull-up control signal; and (vi) a third logic NOR gate adapted to receive the inverse of the first signal, the second signal, and the third signal to generate the pull-down control signal;

(b) an output driver means, connected to said edge detector means to receive said control signals therefrom, for recovering high and low logical levels of said clock signal, the output driver means including:

(i) a pull-up PMOS transistor;

(ii) a NMOS pull-down transistor coupled to said pull-up PMOS transistor, wherein the gate of the said PMOS pull-up transistor being coupled to said pull-up control signal, the drain of said pull-up PMOS transistor being coupled to the drain of the NMOS pull-down transistor and to said input clock signal, the source of the PMOS pull-up transistor being coupled to said voltage supply, a gate of the NMOS pull-down transistor being coupled to said pull-down control signal, and the source of said pull-down NMOS transistor coupled to said electrical ground.

11. The synchronous semiconductor memory device of claim 10, wherein said level detector means further comprises a first level detector means for detecting said high logical level and a second level detector means for detecting said low logical level of said clock signal.

12. The synchronous semiconductor memory device 11, wherein said first level detector means further comprising:

a low-threshold PMOS transistor and a high-threshold NMOS transistor for detecting said high logical level of said clock signal, wherein the gate of said low-threshold PMOS transistor and the gate of said high-threshold NMOS transistor being coupled together and to said clock signal, the drain of said low-threshold PMOS transistor being coupled to the drain of the high-threshold NMOS transistor, the source of said low-threshold PMOS being coupled to a supply voltage, and the source of said high-threshold NMOS transistor being coupled to an electrical ground; and a first inverter having an input terminal coupled to the drain-drain junction of said low-threshold PMOS transistor and said high-threshold NMOS transistor to produce the said first signal, wherein the output terminal of said first inverter being the inverse of said first signal.

13. The synchronous semiconductor memory device 6, wherein said second level detector means further comprises:

a high-threshold PMOS transistor and a low-threshold NMOS transistor for detecting said low logical levels of said clock signal, wherein the gate of said high-threshold PMOS transistor and the gate of said low-threshold NMOS transistor being coupled together, the drain of said high-threshold PMOS transistor being coupled to the drain of the low-threshold NNOS transistor, the source of said high-threshold PMOS transistor being coupled to said supply voltage, and the source of said low-threshold NMOS transistor being coupled to said electrical ground; and a second inverter having an input terminal coupled to the drain-drain junction of the high-threshold PMOS transistor and said second low-threshold NMOS transistor to produce said second signal, wherein the output terminal which is the inverse of said second signal.

14. A method for regenerating a clock signal in a synchronous semiconductor memory, such method comprises the following steps:

detecting a rise edge from a low logical level and a fall edge from a high logical level of said clock signal;

generating a pull-up control signal in response to the detecting of the rise edge of the clock signal;

generating a pull-down control signal in response to the detecting of the fall edge of said clock signal;

recovering said high logical level using the pull-up control signal; and recovering said low logical level using the pull-down control signal.

15. The method of claim 14 wherein the step of generating the pull-up control signal further comprises the steps of:

generating a first signal based on the high logical level;

generating a second signal based on the low logical level; and generating a third signal using the first and the second signal and their complementary signals.

16. A clock repeater for regenerating a clock signal on a clock distribution line, comprising:

an edge detector means for sensing a rising edge and a falling edge of the clock signal and generating respective pull-up and pull-down control signals in response thereto, the edge detector means having a level detector means for generating a first signal and a second signal by detecting a rising edge from a low logical level and a falling edge from a high logical level of the clock signal; and a first logic circuit configured to receive the first signal, an inverse of the second signal, and a third signal based upon the first and second signals to generate the pull-up control signal;

a latch coupled to the edge detector and configured to produce the third signal; and an output driver coupled to the edge detector and configured to receive control signals from the edge detector and recover high and low logic levels of the clock signal.

17. The clock repeater of claim 16 further comprising:

a second logic circuit configured to receive an inverse of the first signal and the inverse of the second signal;

a third logic circuit configured to receive the first signal and the second signal; and a fourth logic circuit configured to receive the inverse of the first signal, the second signal, and the third signal to generate the pull-down control signal.

18. The clock repeater of claim 17 wherein the latch is coupled to an output of the second logic circuit at a first input terminal and to an output of the third logic circuit at a second input terminal and is configured to produce the third signal.

19. A clock repeater to regenerate a clock signal on a clock distribution line, comprising:

an edge detector configured to generate respective pull-up and pull-down control signals based on sensing a rising edge and a falling edge of the clock signal, the edge detector having a level detector configured to generate a first signal and a second signal by detecting a rising edge from a low logical level and a falling edge from a high logical level of the clock signal; and a first logic circuit configured to receive the first signal, an inverse of the second signal, and a third signal based upon the first and second signals to generate the pull-up control signal;

a latch coupled to the edge detector and configured to produce the third signal; and an output driver coupled to the edge detector and configured to receive control signals from the edge detector and recover high and low logic levels of the clock signal.

20. The clock repeater of claim 19 further comprising:

a second logic circuit configured to receive an inverse of the first signal and the inverse of the second signal;

a third logic circuit configured to receive the first signal and the second signal; and a fourth logic circuit configured to receive the inverse of the first signal, the second signal, and the third signal to generate the pull-down control signal.

21. The clock repeater of claim 20 wherein the latch is coupled to an output of the second logic circuit at a first input terminal and to an output of the third logic circuit at a second input terminal and is configured to produce the third signal.

* * * * *

UNITED STATES PATENT AND TRADEMARK OFFICE

CERTIFICATE OF CORRECTION

PATENT NO. : 7,436,232 B2
APPLICATION NO. : 10/666142
DATED : October 14, 2008
INVENTOR(S) : Sivero et al.

It is certified that error appears in the above-identified patent and that said Letters Patent is hereby corrected as shown below:

In column 3, line 52, delete "($V_L$)" and insert -- ($V_L$), --, therefor.

In column 10, line 1, in Claim 13, delete "NNOS" and insert -- NMOS --, therefor.

Signed and Sealed this

Twenty-fourth Day of February, 2009

JOHN DOLL
*Acting Director of the United States Patent and Trademark Office*